United States Patent [19]

Lawman

[11] Patent Number: 5,870,309

[45] Date of Patent: Feb. 9, 1999

[54] HDL DESIGN ENTRY WITH ANNOTATED TIMING

[75] Inventor: Gary R. Lawman, San Jose, Calif.

[73] Assignee: Xilinx, Inc., San Jose, Calif.

[21] Appl. No.: 965,846

[22] Filed: Nov. 7, 1997

Related U.S. Application Data

[63] Continuation-in-part of Ser. No. 938,208, Sep. 26, 1997.

[51] Int. Cl.$^6$ ..................................................... G06F 15/00
[52] U.S. Cl. ............................................................ 364/489
[58] Field of Search ................................... 364/488, 489, 364/490, 491, 468.28, 578

[56] References Cited

U.S. PATENT DOCUMENTS

| | | | |
|---|---|---|---|
| 4,855,726 | 8/1989 | Nishio ...................................... | 340/747 |
| 4,970,664 | 11/1990 | Kaiser et al. ........................... | 364/521 |
| 5,095,454 | 3/1992 | Huang ..................................... | 364/578 |
| 5,150,308 | 9/1992 | Hooper et al. ......................... | 364/489 |
| 5,155,836 | 10/1992 | Jordan et al. .......................... | 395/500 |
| 5,197,016 | 3/1993 | Sugimoto et al. ..................... | 364/490 |
| 5,220,512 | 6/1993 | Watkins et al. ........................ | 364/489 |
| 5,446,675 | 8/1995 | Yoshimura .............................. | 364/489 |
| 5,461,576 | 10/1995 | Tsay et al. .............................. | 364/490 |
| 5,544,067 | 8/1996 | Rostoker et al. ....................... | 364/489 |
| 5,555,201 | 9/1996 | Dangelo et al. ....................... | 364/489 |
| 5,576,979 | 11/1996 | Lewis et al. ............................ | 364/578 |
| 5,594,657 | 1/1997 | Cantone et al. ....................... | 364/490 |
| 5,610,828 | 3/1997 | Kodosky et al. ....................... | 364/489 |
| 5,623,418 | 4/1997 | Rostoker et al. ....................... | 364/489 |
| 5,673,198 | 9/1997 | Lawman .................................. | 364/489 |
| 5,721,959 | 2/1998 | Nakamura et al. ..................... | 395/919 |
| 5,754,442 | 5/1998 | Minagawa et al. .................... | 364/489 |

*Primary Examiner*—Kevin J. Teska
*Assistant Examiner*—Leigh Marie Garbowski
*Attorney, Agent, or Firm*—Lois D. Cartier

[57] ABSTRACT

The invention provides to the user a way of ascertaining the estimated delay through a circuit, by back-annotating the estimated delay through an instantiated macro into the HDL circuit description. Reported delays may include maximum delay, typical delay, and/or minimum delay on the critical path. Using well-known techniques for responding to textual keywords, a software procedure call is initiated whenever an HDL library macro instantiation is detected. The procedure looks up the associated timing data for the macro in a macro or device speeds file and back-annotates the data into the HDL circuit description, preferably as a comment directly following the macro instantiation. In another embodiment, the delay information is added when the file is saved. In yet another embodiment, the delay information is not added to the HDL file, but is written to a report file or displayed on the screen.

19 Claims, 9 Drawing Sheets

XC4000E CLB Switching Characteristic Guidelines

| Speed Grade | | -2 | |
|---|---|---|---|
| Description | Symbol | Min | Max |
| Combinatorial Delays<br>F/G inputs to X/Y outputs<br>F/G inputs via H' to X/Y outputs<br>C inputs via SR through H' to X/Y outputs<br>C inputs via H' to X/Y outputs<br>C inputs via DIN through H' to X/Y outputs | TILO<br>TIHO<br>THH0O<br>THH1O<br>THH2O | | 1.6<br>2.7<br>2.4<br>2.2<br>2.6 |
| CLB Fast Carry Logic<br>Operand inputs (F1,F2,G1,G4) to COUT<br>Add/Subtract input (F3) to COUT<br>Initialization inputs (F1,F3) to COUT<br>CIN through function generators to X/Y outputs<br>CIN to COUT, bypass function generators | TOPCY<br>TASCY<br>TINCY<br>TSUM<br>TBYP | | 2.1<br>3.7<br>1.4<br>2.6<br>0.6 |
| Sequential Delays<br>Clock K to outputs Q | TCKO | | 2.8 |
| Setup Time before Clock K<br>F/G inputs<br>F/G inputs via H'<br>C inputs via H0 through H'<br>C inputs via H1 through H'<br>C inputs via H2 through H'<br>C inputs via DIN<br>C inputs via EC<br>C inputs via S/R, going Low (inactive)<br>CIN input via F'/G'<br>CIN input via F'/G' and H' | TICK<br>TIHCK<br>THH0CK<br>THH1CK<br>THH2CK<br>TDICK<br>TECCK<br>TRCK<br>TCCK<br>TCHCK | 2.4<br>3.9<br>3.5<br>3.3<br>3.7<br>2.0<br>2.6<br>4.0 | |

FIG. 1
(Prior Art)

@I0DLY0=0
@I0DLY1=0
@I1DLY0=0
@I1DLY1=0
@ODLY0=1
@ODLY1=1

```
V 4.1
|
| Wirelist created using VIEWSIM WIRELISTER 4.11
| Using initialization file '/tools/viewlogic/vl4_1/wv4_1/standard/vsm.ini'
|     Using 24 attribute filter(s)
| Long format VIEWSIM file for project XOR2
|
DW XOR2 3 22968322990
M $1I13 BUF ( TPHL=0 TPLH=0 ) $1N15 I1
M $1I14 BUF ( TPHL=0 TPLH=0 ) $1N17 I0
M $1I8 XOR2 ( TPHL=1 TPLH=1 ) O $1N15 $1N17
WD
```

600 points to the three M lines.

FIG. 6 (Prior Art)

```
LCANET, 6
PROG, WIR2XNF, 5.2.0, "created from xor2"
PART, 4003epc84-2
SYM, $1I13, BUF, SCHNM=BUF, =TPLH=0, =TPHL=0
PIN, Q, O, $1N15
PIN, A, I, I1
END
SYM, $1I14, BUF, SCHNM=BUF, =TPLH=0, =TPHL=0
PIN, Q, O, $1N17
PIN, A, I, I0
END
SYM, $1I18, XOR2, SCHNM=XOR2, =TPLH=1, =TPHL=1
PIN, Q, O, O
PIN, A, I, $1N15
PIN, B, I, $1N17
END
EOF
```

@DLYXOR2

2.1 ns 5.9 ns

```
       module controller ();

wire [31:0] Addr, Data;
       wire [2:0] CS, CE;
       wire RD_WR_n, Clk;
       wire [1:0] INT;
100
    ⌐ CPU_core U1 (Addr, Data, CS, CE, RD_WR_n, INT, Clk);
101
    ⌐ DMA_core U2 (Addr, Data, CS[2], CE[2], RD_WR_n, INT[1], Clk);

endmodule
```

FIG. 10

101
⌐ DMA_core U2 (Addr, Data, CS[2], CE[2], RD_WR_n, INT[1], Clk);
102
⌐ /*
104    DMA_core Timing information:
⌐ Technology Library XYZLSI Inc 0.65um version 2.7

105 { Estimated typical critical paths:
    { 26ns starting at CS ending at Data[0].

Additional paths within 10ns of the slowest path:
      25ns starting at CS ending at Data[5].
106   20ns starting at CS ending at Data[1].
      17ns starting at CS ending at Data[3].
118
⌐ /// MORE DMA_core Best case place and route tool effort typically provides
    a 10% improvement on the above delays.
107
⌐ Estimated Delay budget: 70% gates 30% route.

Maximum router effort or floorplanning is required to achieve best case
    performance.

103   Best Case router run time is typically 20% longer than the default run time.
⌐ */

FIG. 11

101
  DMA_core U2 (Addr, Data, CS[2], CE[2], RD_WR_n, INT[1], Clk);
102
  /*
114  DMA_core Timing information:
  Technology Library XYZLSI Inc 0.35um version 1.2

115 { Estimated typical critical paths:
      16 ns starting at CS ending at Data[0].

116 { Additional paths within 2ns of the slowest:
      14.5 ns starting at CS ending at Data[5].
      14 ns starting at CS ending at Data[1].
118
    /// MORE DMA_core Best case place and route tool effort typically provides
  a 10% improvement on the above delays.
117
  Estimated Delay budget 65% gates 35% route.

Maximum router effort or floorplanning required to achieve best case
  performance.
103
  Best Case router run time is typically 20% longer than the default run time.
  */

FIG. 12

HDL DESIGN ENTRY WITH ANNOTATED TIMING

CROSS-REFERENCE TO RELATED APPLICATION

This application is a continuation-in-part of U.S. patent application Ser. No. 08/938,208 invented by Gary R. Lawman entitled "SCHEMATIC DESIGN ENTRY WITH ANNOTATED TIMING" and filed Sep. 26, 1997.

BACKGROUND OF THE INVENTION

1. Field of the Invention

The invention relates to design entry of electronic circuits. More particularly, the invention relates to a method for annotating timing into an HDL description of a circuit.

2. Description of the Background Art

As the electronics industry evolves, the typical operating speed of integrated circuits (ICs) changes frequently. Therefore, it is important for an IC designer to be able to rapidly determine the speed at which a signal will traverse a path through a proposed circuit in the IC. If the signal cannot traverse the path within the desired time period, the circuit may have to be modified or replaced. If the signal will predictably traverse the path in less than the available amount of time, some of the extra time may be used to perform other logical functions. Therefore, it is important to IC designers to be able to predict, with at least some degree of accuracy, the speed at which various portions of their circuits will operate. One field in which this requirement is particularly important is that of Field Programmable Gate Arrays (FPGAs), where a circuit may have different delays when implemented in different speed grades or in different FPGAs, and an FPGA may be selected for use in a system based primarily on the speed of the circuit as implemented in that particular FPGA.

One method for estimating circuit operating speed in an FPGA is a manual estimation technique that involves tracing each delay in the circuit manually and looking up delay values in tables provided by the FPGA manufacturer. One source for such information is "The Programmable Logic Data Book" (hereinafter referred to as "The Xilinx 1996 Data Book"), published in September, 1996 by Xilinx, Inc., and available from Xilinx, Inc., 2100 Logic Drive, San Jose, Calif. 95124. Suppose, for example, that an FPGA user wishes to predict the delay through a simple circuit such as a 2-input exclusive-OR (XOR2) gate, in an XC4003E FPGA device in the –2 speed grade. (Each Xilinx FPGA is assigned, after testing, a number preceded by a dash to indicate to which of several "speed grades" a particular packaged device is assigned. Each speed grade is guaranteed to meet a specific set of corresponding timing requirements.) The FPGA user must first be familiar enough with the architecture of the XC4003E device to realize that the XOR2 circuit can be implemented in a single function generator. The FPGA user can then predict the corresponding delay by consulting page 4–85 of the Xilinx 1996 Data Book, which is incorporated herein by reference, and a portion of which is reproduced in FIG. 1. Consulting this page, which is devoted to "XC4000E CLB Switching Characteristic Guidelines", the FPGA user looks under the heading "Combinatorial Delays" and identifies the symbol "TILO" as representing the delay through a single function generator. "TILO" for the –2 speed grade is 1.6 ns, therefore the delay for an XOR2-gate in an XC4003E-2 device is 1.6 ns. However, this estimated delay does not take into account such factors as net delay in reaching the inputs of the gate, nor a net delay on the gate output. In this case, the FPGA user might estimate a net delay of 0.5 ns, for a total delay through the XOR2-gate of 2.1 ns (1.6 ns block delay +0.5 ns net delay). For some circuits, these net delays can be larger than the delay through the function generator.

As a second example, consider a binary 8-bit counter such as the one shown in FIG. 2. This 8-bit counter comprises eight flip-flops (200–207). Each flip-flop corresponds to one bit of the counter, with flip-flop 200 generating bit Q0 (the least significant bit), flip-flop 201 generating bit Q1, and so forth up to flip-flop 207 generating bit Q7 (the most significant bit). Each flip-flop is reset by signal CLR. The data input D of flip-flop 200 is driven by bit Q0, inverted by inverter 210. Therefore, bit 0 toggles with every active edge on clock CK. The data inputs D of flip-flops 201–207 are driven by XOR2-gates 211–217, respectively. XOR2-gate 211 has as inputs Q1 (the related counter bit) and carry-in signal CIN1 (which could equally correctly have been labeled Q0 or as carry-out signal COUT0). Carry-in signal CIN1 and bit Q1 are also ANDed together in AND2-gate 221 to generate carry-out signal COUT1 (which is labeled CIN2, since it also forms the carry-in signal for the next bit). The other XOR2-gates 212–217 and AND2-gates 222–226 are similarly connected to the outputs Q2–Q7 of their corresponding flip-flops 202–207.

To manually estimate the delay through the counter the FPGA user must understand how the logic will be mapped into FPGA configurable logic blocks (CLBs) and function generators in the target FPGA device. When the counter shown in FIG. 2 is mapped into an XC4003E device, two bits of the counter will be placed in each CLB, as shown in FIG. 3. FIG. 3 indicates (by way of boxes 330, 332, 334, 336) the mapping of the logic in the counter into four CLBs. The maximum operating speed of this counter is determined by the settling time of the carry chain from least significant to most significant bit. The critical path (the path determining the maximum operating speed of the circuit) therefore comprises the path from clock CK, through flip-flop 200 to output Q0), then along the carry chain through AND2-gates 221, 222, 223, 224, 225, and 226, through XOR2-gate 217, and a setup time at flip-flop 207. Net delays from flip-flop output Q0 to the input of AND2-gate 221, and from each AND2-gate to the succeeding AND2-gate, must be added as well. The FPGA user can therefore calculate the estimated speed of the counter by summing: 1) clock-to-out for flip-flop 200; 2) six times the estimated average net delay from a flip-flop or AND2-gate output to an AND2-gate input; 3) five times the delay through an AND2-gate (one function generator delay each); 4) the delay through AND2-gate 226 and XOR2-gate 217 (one function generator delay for both); and 5) the setup time on input D of flip-flop 207. Consulting the data book information in FIG. 1, and estimating the average net delay based on previous experience with FPGAs, the estimated delay through the critical path for the counter of FIGS. 2 and 3 can be calculated:

$$\begin{aligned} \text{Delay} &= TCKO + (6 * \text{estimated net delay}) + \\ &\quad (5 * 1.6\, TILO) + TILO + TICK \\ &= 2.8\,ns + (6 * 0.4\,ns) + (5 * 1.6\,ns) + 1.6\,ns + 2.4\,ns \\ &= 17.2\,ns \end{aligned}$$

However, to provide a third example of manual delay estimation, XC4000E CLBs also offer special fast carry logic, and library macros (schematic or HDL circuit descriptions or symbols representing commonly used circuits, such as counters) that use this special logic are provided to XC4000E users. Speed estimation methods for counters and adders that use the fast carry logic are explained in Xilinx Application Note XAPP018 (Version 2.0), entitled "Estimating the Performance of XC4000E Adders and Counters", published Jul. 4, 1996 and available from Xilinx, Inc., 2100 Logic Drive, San Jose, Calif. 95124, which is incorporated herein by reference. Briefly, the propagation delay of an 8-bit counter using fast carry logic comprises the following delays: 1) the delay in getting onto the carry chain in the first CLB, corresponding to CLB 330; 2) two times the delay on the carry chain through a single CLB (two CLBs of two bits each, corresponding to CLBs 332 and 334); and 3) the delay in getting off the carry chain in the fourth CLB, corresponding to CLB 336. The delay can therefore be calculated using the formula:

$$Delay=TOPCY+(2*TBYP)+TSUM$$

Consulting the data book information in FIG. 1, the estimated delay of this counter in an XC4003E device with a −2 speed grade is found to be:

$$Delay=2.1 \text{ ns}+(2*0.6 \text{ ns})+2.6 \text{ ns}=5.9 \text{ ns}.$$

Therefore, it is seen that the delay of even a simple circuit such as a counter may be heavily dependent on the particular implementation used in the macro, and the manual estimation method may be relatively involved.

A more automated method currently used for estimating the speed of an FPGA circuit involves mapping, placing, and routing the design, and writing out a netlist description of the completed design. (A "netlist" is a description of a circuit comprising a list of low-level circuit elements or gates and the connections (nets) between the outputs and inputs thereof. A netlist is typically stored as one or more computer files.) The next step is to run a software tool that inserts delays into the netlist corresponding to the delays that will be incurred by a signal traversing each element in the netlist. These delays are typically read from a file called a device speeds file. (A device speeds file may include delays for one or more different FPGAs or other programmable ICs, or may include delays for one or more elements in a standard cell library that may be used for designing custom ICs.) The device speeds file may be encrypted. A given FPGA device speeds file is typically specific to a particular FPGA device, and may include information for several different speed grades of the device. After inserting timing delays into the netlist, the software tool produces a report on the overall speed of the resulting design, or it can be directed to report the delay associated with a particular path through the design. One such software tool is the XDelay software from Xilinx, Inc. A step-by-step description of how to use the XDelay software to report path delays in a mapped, placed, and routed FPGA design is included in pages 15–39 through 15–43 of the "XACT Viewlogic Interface User Guide", published April, 1994, available from Xilinx, Inc., 2100 Logic Drive, San Jose, Calif. 95124, which are incorporated herein by reference. These methods typically produce relatively accurate reports of timing delays to be expected from the circuit when programmed into an FPGA.

One automated method for displaying timing for an FPGA circuit is described by Lawman and Wells in U.S. Pat. No. 5,673,198, "Concurrent Electronic Circuit Design and Implementation", which is incorporated herein by reference and title to which is held by the assignee hereof. However, this method requires software post-processing to map, place, and route the circuit before a timing estimate can be provided. This post-processing is often time-consuming.

FIG. 4 shows a schematic for an XOR2-gate that is used when designing circuits for Xilinx FPGAs using the Workview schematic entry environment from Viewlogic Systems, Inc. The XOR2-gate is an element in a library of macros provided by Xilinx or by Viewlogic Systems, Inc. to their customers. This XOR2-gate schematic is also a simulation model used to perform logic and timing simulations of the XOR2-gate and of higher-level schematics incorporating this gate. The schematic includes timing information for the gate. As shown in FIG. 4, the schematic comprises two buffer symbols 401, 402 and one symbol 403 representing the exclusive-OR function. Each of symbols 401, 402, 403 has two associated timing variables. For example, symbol 403 has the notation "TPLH=@ODLY1", which means that the Timing Period on the Low to High transition when passing through this logic is represented by a variable "ODLY1". Similarly, the notation "TPHL=@ODLY0" on symbol 403 means that the Timing Period on the High to Low transition is represented by a variable "ODLY0".

FIG. 5 shows the Workview XOR2 schematic symbol that corresponds to the XOR2 schematic of FIG. 4. (Timing attributes have been made visible using the Workview "Change Attributes Visible" command. Attributes other than timing variables are not shown in FIG. 5.) The timing variables from the schematic of FIG. 4 are also present in the schematic symbol of FIG. 5, and in FIG. 5 they are assigned default values. For example, the notation "@ODLY1=" means that the default delay for the low to high transition on symbol 403 is 1 timing unit, or 0.1 ns. (The basic time unit for Workview is 0.1 nanoseconds, or 100 picoseconds.) The notation "@IODLY0=0" in FIG. 5 means that the default delay for the high to low transition of symbol 402 is 0 ns. These attributes on the symbol are the Workview software's method of passing the timing information from the simulation model (shown in FIG. 4) to the Workview simulator. This timing information is nominal and does not reflect the performance of the circuit in a mapped, placed, and routed design. Therefore, it has no value for delay estimation purposes.

When the XOR2-gate of FIGS. 4 and 5 is converted to a Viewsim™ simulation netlist, the simulation netlist is written as appears in FIG. 6. (Viewsim is the Workview simulation software tool. Viewsim is a trademark of Viewlogic Systems, Inc.) The netlist description of FIG. 6 provides an example of how timing delays can be incorporated into a netlist. In this example, each symbol is represented by a single line of text. For example, symbol 403 is represented by line 600. FIG. 7 shows another type of netlist showing incorporation of the default delays. The netlist of FIG. 7 is in Xilinx. Netlist Format (XNF). In this netlist, symbol 403 is represented by lines 12 through 16 (labeled 700). To obtain a netlist having actual delays rather than the default values for TPHL and TPLH, the circuit must be mapped, placed, and routed, and the resulting netlist must be back-annotated with delays using the XDelay program.

An advantage to this automated method is that it is no more difficult for a user to obtain the delay through a large, complicated circuit than it is through a simple circuit such as an XOR2-gate, although it may take longer because of increased software execution time. A disadvantage of this method for estimating FPGA circuit delays is that the circuit must be implemented (mapped, placed, and routed) before the user can receive any information about the speed of the circuit. If design changes are made as a result of the timing information, the circuit must be reimplemented to assess the results of the changes. Further, in order to implement the circuit, the circuit must be transformed into a complete FPGA design, i.e., input/output pads must be added, and each circuit output must either drive some destination circuitry or be marked so the software will retain what appears to be unused logic. This process can therefore be time-consuming. Some FPGA users prefer to make one or more iterations of the design process based on a manual estimation of the delay through the circuit, before proceeding to the accurate estimations produced by the above method.

Another common method of describing a circuit, other than with a schematic, is by textual description in a Hardware Description Language (HDL). There are several standard HDL languages; two commonly used HDL languages are Verilog and VHDL. In addition, there are a number of distinct coding styles for entering a circuit description in an HDL, including behavioral, dataflow, and structural descriptions. These languages and coding styles are well known in the HDL art and are not discussed in detail herein. Exemplary circuit descriptions herein are written in the Verilog language.

A common technique used in HDL circuit descriptions is the instantiation (essentially the inclusion of a copy by reference) of a previously implemented macro. The following Verilog code fragment shows the instantiation of an exemplary macro:

CPU_core U1 (Addr, Data, CS, CE, RD_WR_n, INT, Clk);

In this example the macro is named 'CPU_core'. This particular instance (instantiation) has a unique instance reference name U1. The list of signal names (in parentheses) is called a port list. In this example, the port list shows that the CPU_core macro has connections to an address bus (Addr), a databus (Data), and numerous control signals (signal lines or buses) such as CS (Chip Select), CE (Chip Enable), and so forth. The port list is used to connect the macro to other portions of the design, which often includes other such instantiations. For example, in addition to instance U1 above, a design may contain an instantiated DMA core such as the following:

DMA_core U2 (Addr, Data, CS[2], CE[2], RD_WR_n, INT[1], Clk);

In this example, the two macros are connected by way of the commonly labeled signals through the macro ports in the port list. For example, the CS[2] entry in the DMA core's port list indicates that the DMA is connected to bit 2 of the CPU core's CS bus, while the two macros share clock signal "Clk".

In Verilog, the port names in the instantiation port list may or may not be the same names as those used for the same ports within the library macro. However, instantiation port names are assigned to the macro ports based on the order in which they appear in the port list (as in the examples above), or alternatively can be connected in the instantiation port list using notation such as ".macro_internal_port_name (instantiation_name)".

An HDL description (which may optionally contain one or more macro instantiations) typically describes in text form the desired structure or behavior of a circuit, and the HDL description is then compiled or synthesized by HDL synthesis software to produce a netlist. This netlist may be substantially similar to a netlist produced from a schematic. The delay through an HDL circuit can therefore be estimated using the same methods used for schematic circuits, i.e., by manually estimating the delay through each element and adding the delays, or by mapping, placing, and routing the circuit and running timing estimation software such as the XDelay software from Xilinx, Inc. The manual estimation method may be more difficult with an HDL description than with a schematic description, because it is not always apparent from the HDL description (particularly a behavioral description) what circuit elements will be used to implement the circuit.

It is desirable to have a way of estimating the delay through an FPGA circuit from either a schematic description or an HDL circuit description, without consulting a data book, without manually adding together many small delays, and without mapping, placing and routing the circuit.

SUMMARY OF THE INVENTION

A first aspect of the invention provides a way of providing the estimated delay through a circuit to the user, by placing a timing attribute on the schematic symbol for the circuit that automatically displays the delay. Reported delays may include maximum delay, typical delay, and/or minimum delay on the most critical paths. In a first embodiment, the schematic entry software consults a macro speeds file to obtain delay information for the macro. A macro speeds file is a file including delay information for one or more macros. The macro speeds file may be in encrypted form. In a second embodiment, the macro delay information is added to a standard device speeds file. In a third embodiment, the symbol file (or other file) for the macro includes a formula for the critical path delay through the macro, based on the delays in the standard device speeds file. In this third embodiment, the schematic entry software uses the standard device speeds file to calculate the macro delay.

According to a second aspect of the invention, schematic-entry software accepts mouse-driven input designating starting and ending points on a path, and reports the path delay between these points. According to a third aspect of the invention, schematic-entry software accepts mouse-driven input designating a group of schematic symbols and reports the path delay on the critical paths through the circuit comprising the designated symbols.

Another aspect of the invention provides a method for providing the estimated delay through an HDL macro circuit to the user, by back-annotating the estimated delay through an instantiated macro into the HDL circuit description. Using well-known techniques for responding to textual keywords, when an HDL library macro instantiation is detected, a software procedure call is initiated. The procedure looks up the associated timing data for the macro in a macro or device speeds file and back-annotates the data into the HDL circuit description, preferably as a comment directly following the macro instantiation. In another embodiment, the delay information is added when the file is saved. In yet another embodiment, the delay information is not added to the HDL file, but is written to a report file or displayed on a screen.

BRIEF DESCRIPTION OF THE DRAWINGS

The present invention is illustrated by way of example, and not by way of limitation, in the following figures, in which like reference numerals refer to similar elements.

FIG. 1 shows a portion of a Xilinx data book page used to make manual estimations of delays through a macro.

FIG. 6 shows the simulation netlist for an XOR2-gate, for Viewsim, the Workview simulator.

FIG. 7 shows the XNF netlist for an XOR2-gate.

FIG. 10 shows an exemplary Verilog circuit description.

FIG. 11 shows an exemplary Verilog circuit description with back-annotated timing information according to one aspect of the invention.

FIG. 12 shows the Verilog description of FIG. 11 with updated back-annotated timing information according to one embodiment of the invention.

DETAILED DESCRIPTION OF THE DRAWINGS

Methods for annotating estimated timing delays onto schematic and HDL circuit descriptions according to the invention are described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Annotating Timing Information Onto a Schematic

Figure 2:
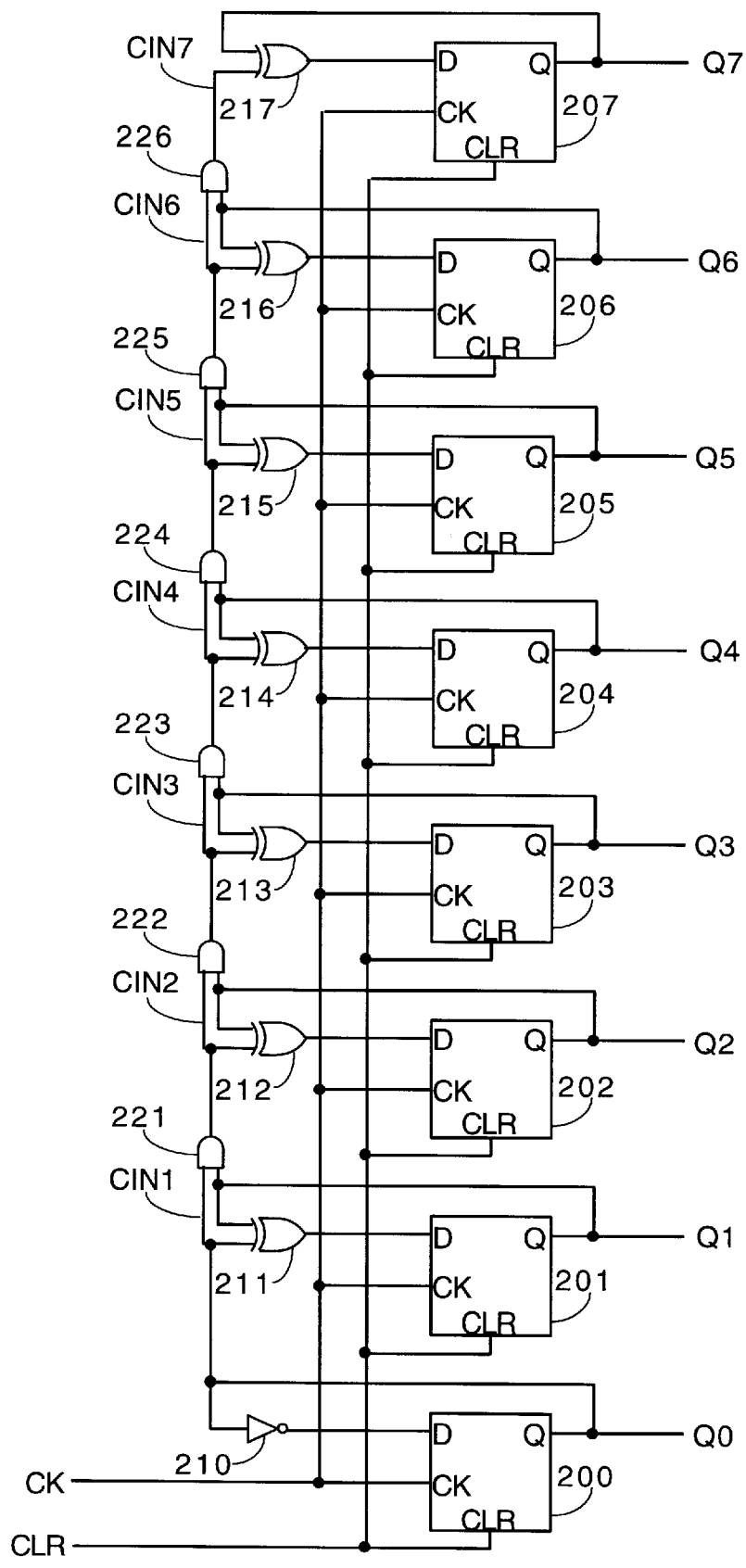
FIG. 2 shows an 8-bit counter.
Figure 3:
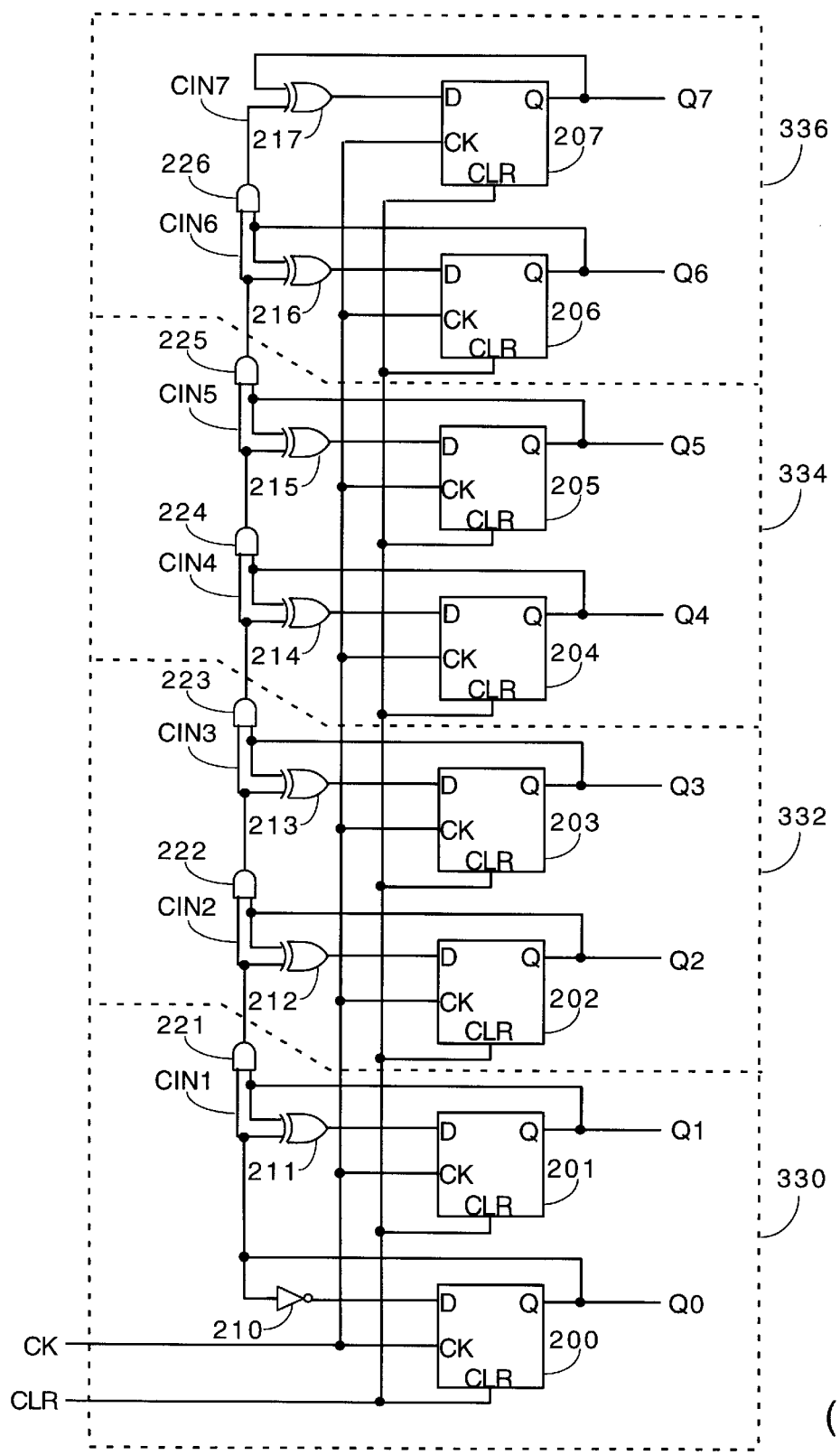
FIG. 3 shows how the 8-bit counter of FIG. 2 is mapped into a Xilinx XC4003E device.
Figure 4:
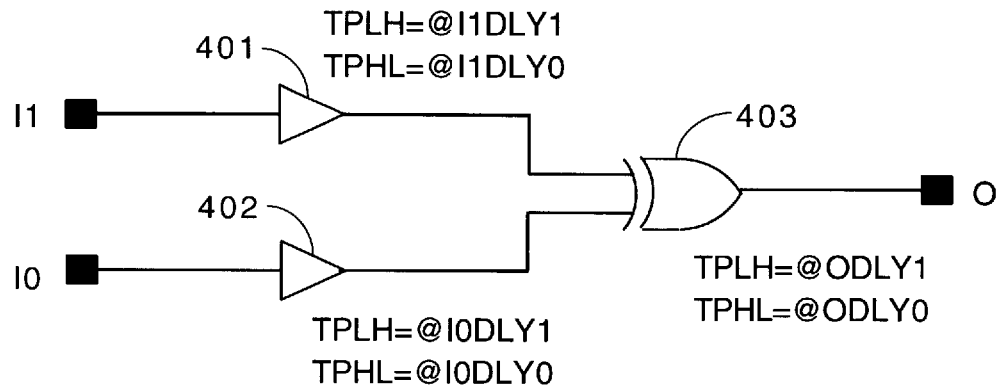
FIG. 4 shows the Workview schematic simulation model for an XOR2-gate.
Figure 5:
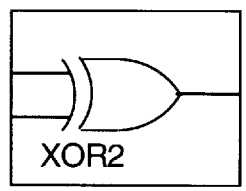
FIG. 5 shows the Workview symbol for an XOR2-gate, with timing attributes.
Figure 8A:
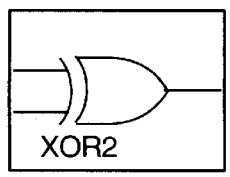
FIG. 8A shows a symbol according to the invention as it would appear in a symbol editor, with the timing attribute displayed.
Figure 8B:
FIG. 8B shows a symbol according to the invention placed in a higher-level schematic, the symbol representing an XOR2-gate and displaying the delay through the XOR2 circuit.

FIG. 8A shows a macro symbol for an XOR2-gate as it would appear in a symbol editor, with the associated timing attribute @DLYXOR2 displayed. Timing attribute @DLYXOR2 is somewhat similar to the attributes @ODLY0 and @ODLY1 of FIGS. 4 and 5. However, timing attribute @DLYXOR2 provides additional functionality compared to prior art attributes @ODLY0 and @ODLY1. In accordance with the invention, when the macro symbol is placed in a higher-level schematic as in FIG. 8B, the symbol is displayed with a numerical value given for the estimated delay. In FIG. 8B, the displayed delay for the XOR2-gate is 2.1 ns, the block delay (delay through the CLB) of 1.6 ns plus the estimated net delay of 0.5 ns, in accordance with the first example of manually estimating circuit operating speeds.

Figure 8C:
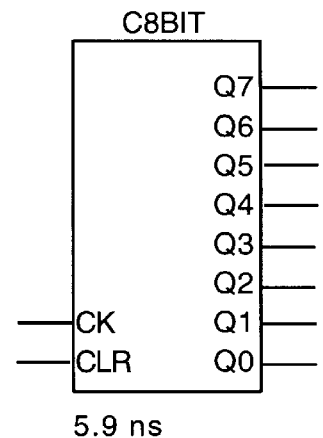
FIG. 8C shows a symbol according to the invention placed in a higher-level schematic, the symbol representing an 8-bit counter and displaying the delay for the critical path through the counter.

FIG. 8C shows a macro symbol for an 8-bit counter annotated with estimated timing according to the invention. In FIG. 8C, the displayed delay for the 8-bit counter using fast carry logic is 5.9 ns. (This is the same counter used in the third example of manually estimating circuit operating speeds, above.) Note that for an FPGA user, estimating the delay through the counter is now a simple matter of placing the schematic symbol for the counter macro into a higher-level schematic, rather than the steps of investigating the counter schematic, figuring out how the logic will be apportioned into CLBs, determining the critical path, looking up block delays in a data book, estimating net delays, and adding the incremental delays to produce a total estimated delay for the counter. In one embodiment, the critical path for which the delay is reported is shown on or near the displayed symbol, either in text form, by highlighting the terminals of the critical path, by drawing a line between the terminals, or by other means. In another embodiment, multiple delays are reported where several critical paths having similar delays are present. In this embodiment, the terminals of the critical paths may be visually identified with the delays to which they correspond, for example by highlighting the terminals of each path and the associated delay in the same color. In one embodiment, a color code based on the well-known resistor color code is used. The most critical path is shown in black, the next most critical is shown in brown, followed by red, orange and so forth. In another embodiment, the criticality is indicated by a color range from black through blue, red, and orange and on to white. This display method draws an analogy between delay and temperature. The more a delay differs from the critical path delay, the greater the difference in color.

Figure 9A:
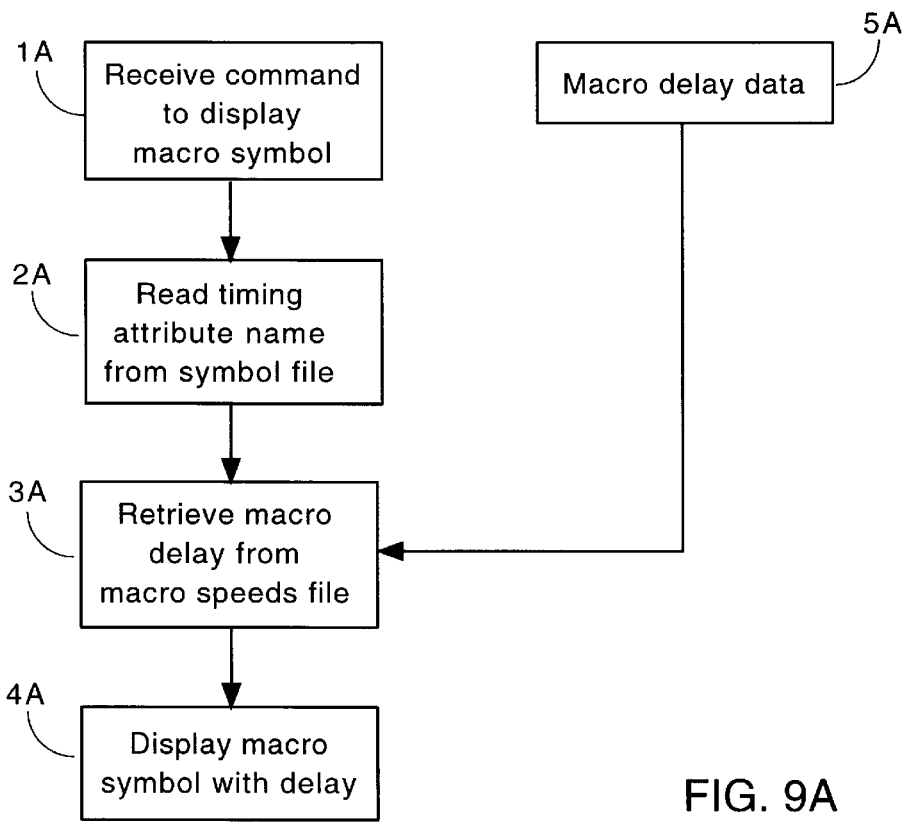
FIG. 9A shows a flow chart for annotating macro delays onto a schematic according to a first embodiment of the invention.

According to a first embodiment of the invention, the schematic entry software displays the macro delay by following the series of steps shown in FIG. 9A. In step 1A, a command is received to display the schematic symbol representing the macro. The command may be received as a distinct command from a user (such as an Add Component command in Workview), or as a result of an automatic display function (such as when viewing an existing schematic already containing the macro symbol), or in some other fashion. In step 2A, in response to the received command, the schematic entry software reads the timing attribute from the symbol file (the file storing the display information for the symbol). (In one embodiment, the timing attribute is stored in a different file. In another embodiment, the schematic entry software uses the name of the macro, or a variation thereof, as the timing attribute, and no other timing attribute is stored.) In step 3A, the schematic entry software retrieves the macro delay from a macro speeds file 5A that contains delay information for the timing attribute. In step 4A, the macro delay is displayed with the macro symbol, as shown in FIGS. 8A and 8B. In one embodiment, the speed grade is specified by a separate attribute, and a default speed grade is used if none is so provided. The macro speeds file includes separate timing information for each available speed grade.

Figure 9B:
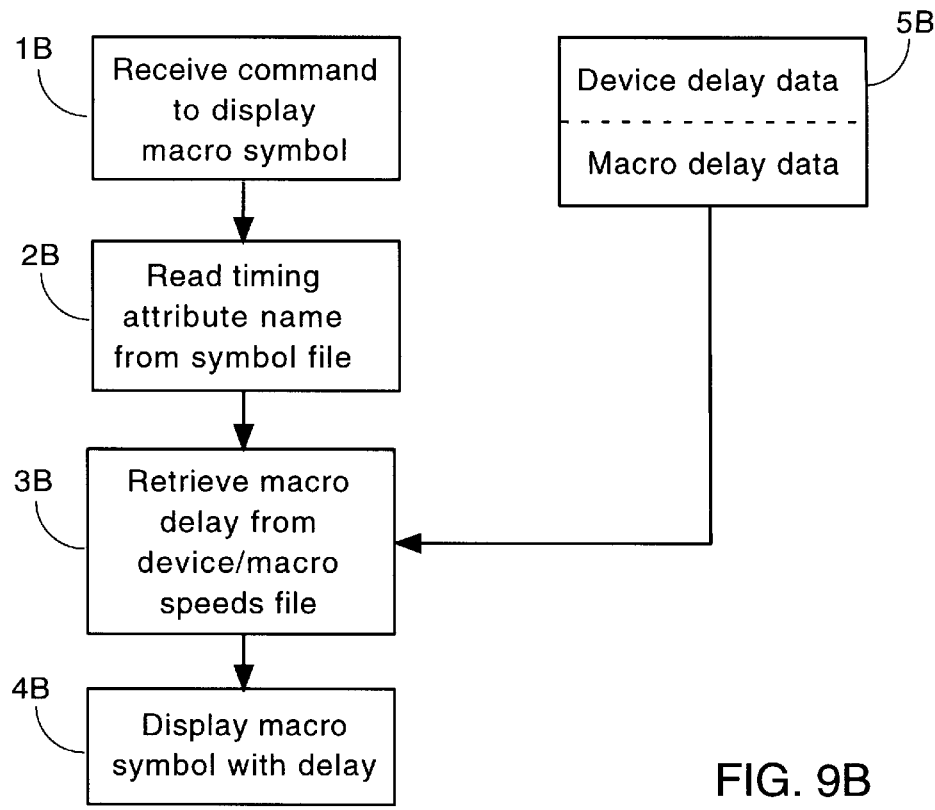
FIG. 9B shows a flow chart for annotating macro delays onto a schematic according to a second embodiment of the invention.

According to a second embodiment of the invention, the schematic entry software displays the macro delay by following the series of steps shown in FIG. 9B. The second embodiment is similar to the first embodiment, except that in step 3B the schematic entry software retrieves the macro delay from a device/macro speeds file 5B that contains delay information for the timing attribute as well as device delay data commonly stored in a device speeds file. (Device delay data includes delay information for possible paths through a CLB (such as that shown in FIG. 1) or an input/output block (IOB), as well as net delay information. Separate delay data is provided for each available speed grade.)

Figure 9C:
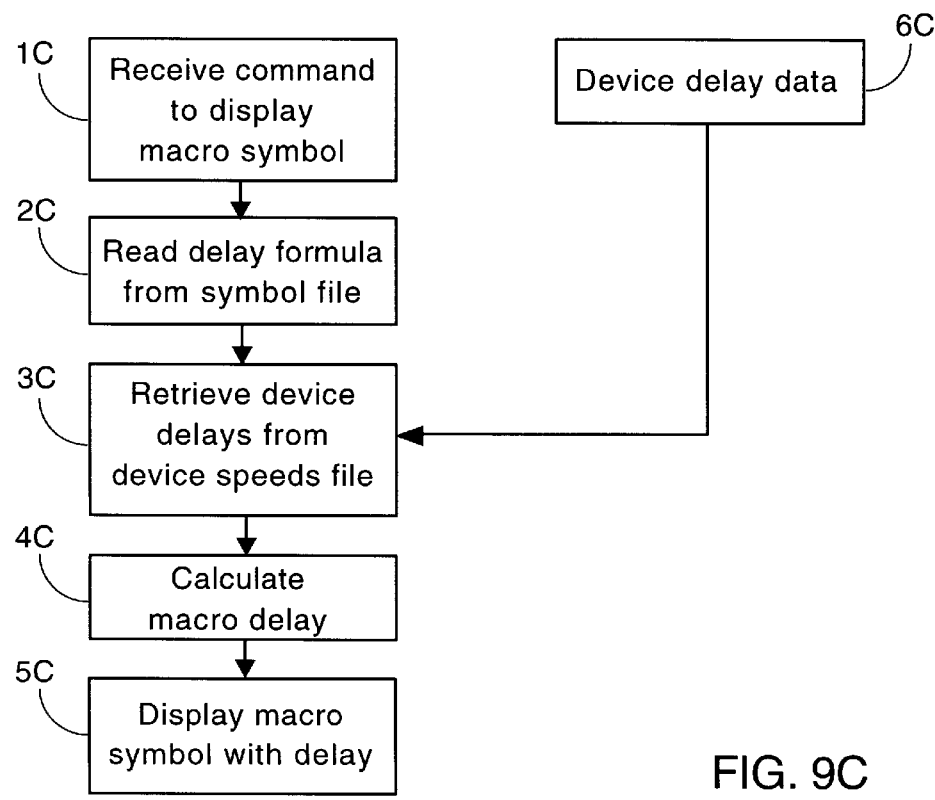
FIG. 9C shows a flow chart for annotating macro delays onto a schematic according to a third embodiment of the invention.

According to a third embodiment of the invention, the schematic entry software displays the macro delay by following the series of steps shown in FIG. 9C. In step 1C, a command is received to display the symbol representing the macro. In step 2C, in response to the received command, the schematic entry software reads from the symbol file the delay formula representing the macro delay in terms of delays included in the device speeds file. (In another embodiment, the delay formula is stored in a different file.) In step 3C, after reading the delay formula, the schematic entry software retrieves the device delays from the device speeds file 6C. The next step (step 4C) is to calculate the macro delay based on the timing formula and the delays retrieved from the device speeds file. This step may involve adding together the delays from the device speeds file as dictated by the formula, including whatever net delays the formula may specify. In step 5C, the macro delay is displayed with the macro symbol, as shown in FIGS. 8A and 8B. An advantage of this embodiment is that a device speeds file already in use need not be altered to add the delay annotation functionality.

In some embodiments, more than one macro delay is displayed for a single macro symbol. These macro delays can designate different paths through the macro, different conditions (such as maximum and minimum speeds), different FPGA devices, or different FPGA device speed grades. Such options would assist an FPGA designer in making choices such as which FPGA device to use. In some embodiments, the schematic entry software provides options to select one or more of multiple available macro delays for display. In one embodiment, block delays and net delays are separately displayed.

According to a second aspect of the invention, a path is designated by pointing to and designating the terminal points (endpoints) of the path with a mouse or other pointing device. Any of the delay calculation techniques described above is then applied to the designated path and graphically displayed or written to a log file, preferably along with the names of the terminal signals.

According to a third aspect of the invention, an area of the graphically displayed circuit schematic is designated with a mouse or other pointing device. The area designation can be accomplished by designating two corners of a rectangular area, by "drawing" a line around the area, or by other well-known techniques. Schematic symbols within the designated area are then analyzed using any of the delay calculation techniques described above to determine the most critical paths. The delays through the most critical paths are reported, in one embodiment along with the names of the terminal signals of those paths. In one embodiment, the terminals of the most critical path are highlighted. In another embodiment, the number of critical paths to be displayed is a user-specified option. In yet another embodiment, the user can specify a delay period (e.g., 5 nanoseconds) such that any paths having a delay within the delay period of the most critical path are to be displayed.

Annotating Timing Information Into an HDL Description

Another embodiment of the invention back-annotates the estimated delay through an instantiated macro into the HDL circuit description. An exemplary HDL circuit description comprising two macro instantiations is shown in FIG. 10. This circuit description represents a CPU core combined with a DMA core. Both the CPU and the DMA are instantiated as macros (in lines 100 and 101, respectively).

In designing a circuit, there are typically timing restrictions which must be met. In this example, the DMA core and the CPU must be able to communicate over the Addr, Data, and control buses at 40 MHz. Therefore, the worst case critical path can have a delay of no more than 25 nanoseconds.

Delays through the macro vary depending on several factors depending on the target FPGA or ASIC, if an FPGA or ASIC is to be used to implement the design. Other possible factors include targeted operating temperature and the speed grade of the target FPGA or ASIC. If the design will be implemented in custom silicon, the delay can be estimated based on feature sizes (such as gate length) of the target process. Such information is typically passed to the synthesis software by referencing in a configuration file one or more technology libraries for the FPGA, ASIC, or target process.

The synthesis software takes a description such as that shown in FIG. 10 and generates from this description and the referenced macros a structural netlist composed of primitive elements such as NAND gates, registers, inverters, and so forth. For FPGAs, a further software tool reads in the structural netlist, and maps, places and routes the design. Depending on whether the final target is an FPGA, ASIC, or custom silicon, the subsequent implementation steps may include bitstream generation or mask generation.

In the traditional back-annotated timing flow, the critical path is determined after the routing step. At this point, the designer can run a static timing analysis on the routed design (for example, using the Xilinx XDelay software referenced above) to generate a timing report for the critical path and any other paths as desired. In the example of FIG. 10, the chip design comprises two library macros. In this simple case, using the method of the invention much of the final timing information can be estimated as the HDL description is entered. As previously described, gate delays can generally be estimated fairly closely, while net delays depend on the final placement and routing in the target device. According to the method of the invention, gate delays are stored in a macro or device speeds file as they were for the schematic embodiments of the invention.

It is well-known for software text editors to provide context-sensitive information to the user as text is typed into the editor. One such editor is Microsoft Word 97, which includes a spell checker that checks spelling as words are entered on a keyboard. In the case of a so-called "programmer's editor" such as GNU Emacs v19.34, the word recognition technique used in such spell checkers has been extended to enhance the editing of the more common computer programming languages, including Perl, Pascal, C, C++, and Java™. (Java is a trademark of Sun Microsystems, Inc.) For these languages, Emacs enables the color coding and automatic indentation of certain language-specific keywords following a set of user defined rules. Such software techniques can reduce coding errors. Some editors, such as the Lucid Emacs editor, are even more specifically enhanced to assist the programmer by doing language syntax checks. (The Lucid Emacs editor v19.10 is an X-WINDOWS-only version of GNU Emacs and is in the public domain.) In the case of Lucid Emacs, these syntax checks are executed in response to a menu-driven command. However, they could be dynamically executed using the same techniques employed in a spell checker that runs concurrently with the text entry process as in Microsoft Word 97. In summary, the methods of recognizing keywords and effecting concurrent feedback to the user are well known to those skilled in the art of programming such editors. In fact the full source code for GNU Emacs is currently publicly available from the Free Software Foundation at 59 Temple Place, Suite 330, Boston, Mass. 02111.

Using the same software techniques that GNU Emacs uses to recognize keywords, the entry of the text "DMA_core" into the design source code is recognized as beginning an instantiation of the DMA_core library macro. On recognition of this keyword, a software procedure call is made (or a sub-process is initiated) that reports the associated timing data for the instantiated macro, as implemented in the specified technology library. Such timing information may be stored in a macro speeds file, a device speeds file, or in another form, as in the schematic embodiments of the invention. Once the timing data has been retrieved, the data is automatically inserted into the text, preferably as one or more comment lines.

In one embodiment of the invention, the timing annotation procedure is called as soon as the keyword command is recognized. In this embodiment, since the port list has not yet been entered, the names used in reporting timing information are the lower-level port names from the macro. In other embodiments, the procedure is not called until the close parenthesis of the port list is entered, or until the line is terminated with a carriage return. In these embodiments, the timing information may be reported using the higher-level port names used in the HDL description. In yet another embodiment, the procedure is called as soon as the keyword command is recognized, the timing information is annotated into the HDL description using the lower-level port names, and the port names in the timing information are updated to the corresponding higher-level port names once the port list has been completely entered.

FIG. 11 shows an exemplary Verilog circuit description with back-annotated timing information. The back-annotated timing information extends from the "comment begin" characters on line 102 to the "comment end" characters on line 103. As shown on line 104, the target semiconductor process has a 0.65 micron feature size. Other useful information affecting the speed of the macro can be included here, such as the target FPGA or ASIC. By including this type of information, the file can be printed or saved for later comparison of the estimated operating speeds of several different processes, FPGAs, or ASICs.

Lines 105 display the estimated delay through the critical path of the macro as well as the starting and ending points of the path. Additional critical paths can be displayed (see lines 106) as in the schematic case. In the embodiment of FIG. 11, it is specified in a configuration file that any paths within ten nanoseconds of the critical path delay be reported. In another embodiment, the number of paths to be displayed is specified in the configuration file. Another embodiment provides comparative reports, for example, reporting one or more delays through the macro for two or more different ASICs, FPGAS, process technologies, or speed grades. One embodiment allows the user to select the type of comparison to be displayed.

Other information such as the delay factor allotted for net delays (line 107, Estimated Delay budget) can also be provided. In one embodiment, the net delay is estimated by apportioning a fixed percentage of the total path delay to the net delay. In the embodiment of FIG. 11, 30% of the total delay is assumed to be net delay and 70% is assumed to be gate delay. Therefore, the net delay is estimated by multiplying the calculated gate delay by 3/7. In this embodiment, the net delay factor is set in a configuration file. In one embodiment, the net delay factor is different for different macros.

With the timing information inserted into the HDL description in response to the instantiation as in FIG. 11, it is clear as soon as the DMA core is instantiated, and well before running the mapping, placement and routing tools, that the DMA core in the specified target technology does not meet the design timing criterion of 25 nanoseconds for the critical path. At the very earliest stages of the design process, the designer is informed and able to begin exploring alternative strategies to achieve the required timing. These alternatives may include the following options:

1. Floorplan the macro.
2. Redesign the macro's internal structure to optimize for performance, perhaps taking advantage of newly implemented technology library features that were not available when the macro was originally designed.
3. Re-optimize the macro's internal design using a synthesis tool.
4. Change the technology library to target a faster semiconductor process (e.g., 0.35 micron instead of 0.65 micron gate lengths).

Changing the technology library as in the fourth option can be accomplished in any of several ways. In one embodiment, the technology library is chosen using a menu option or some other user interface control. In another embodiment, technology library selection is automated using a keyword recognition technique similar to the macro instantiation keyword technique previously described. For example, the following text entry in the Verilog code is recognized as containing a keyword command (also referenced herein as a "keyword"):

/// TECHNOLOGY LIBRARY=XYZLSI Inc 0.35 um version 1.2

This example includes four different keyword commands for one embodiment: "TECHNOLOGY LIBRARY", "XYZLSI Inc", "0.35 um", and "version 1.2". This entry specifies a technology library in terms of the exact vendor, process, and technology library version to be used.

FIG. 12 shows the Verilog description of FIG. 11 with updated back-annotated estimated timing information after changing the technology library. Prior to generating the text of this example, other configuration information such as the criterion for reporting additional paths and the net delay factor were also changed in the HDL editor. Line 114 reflects the new technology library with a gate length of 0.35 micron. Lines 116 show that timing paths within two nanoseconds of the critical path are now reported. Line 117 shows that the net delay factor was changed from 30% to 35%. Lines 115 show that the delay through the DMA core (now 16 nanoseconds) is small enough that the design criterion of a maximum 25 nanosecond path delay is probably achievable, and the 0.35 micron target technology is worth further investigation.

Many enhancements to this technique are readily apparent, such as allowing the user to interactively request more or less information by typing embedded keywords into the design's source file. One such example is shown in line 118 of FIGS. 11 and 12, where entering the keywords "/// MORE DMA_core" provides additional information about the macro delays. Similarly, in one embodiment entering the keyword "/// SIZE" elicits information on the size of the most recently instantiated macro (e.g., the number of logic elements or area required to implement the macro).

Embedded command texts such as "/// SIZE" drive context related processes. For example, a request for library data on the size of the DMA_core macro cannot be successfully processed before the technology library has been specified.

In one embodiment, a "/// COMPILE" command text initiates a software procedure that synthesizes (compiles) the HDL description. Another embodiment further places and routes the design in a targeted FPGA. These embodiments provide relatively accurate timing estimates, but require more time to execute than some other embodiments.

In one embodiment, the delay information is added when the file is saved. In this embodiment, the following series of steps is followed: a) a command to save the HDL description to a file is received; b) the HDL description is scanned for library macro instantiations; c) for each such instantiation, a timing annotation procedure is called; d) the macro timing information is retrieved from a speeds file comprising delay information for the macro; e) the timing information is added to the HDL description; and f) the HDL description is saved to a file.

In one embodiment, the HDL description with back-annotated timing information is not saved with the same filename as the original HDL file. Instead, the back-annotated HDL description is saved to a secondary file having a file name modified to indicate that it includes timing information. For example, if the original HDL file is called "my_design.v", the back-annotated file is called "my_design_time.v".

In another embodiment, the delay information is added after a specified time (e.g., five seconds) has elapsed wherein the user has entered no new text into the HDL specification.

In one embodiment, the methods described in relation to FIGS. 10–12 are used to enhance a schematic design entry tool. In this embodiment, the schematic entry tool is written to accommodate the entry of text associated with schematic symbols, a common feature. The embedded command text methods described in relation to FIGS. 10–12 are then applied to the entered text.

Another embodiment is a combination of the HDL and schematic aspects of the invention. In a schematic editor, the user clicks a mouse button with the cursor placed on a particular portion of a macro symbol (preferably marked with a recognizable mark such as a box with an "x" inside), and thereby invokes a text editor. (In other embodiments, an "initiate delay calculation" command is activated and a symbol is afterwards selected, or a symbol is selected and an "initiate delay calculation" command is then activated.) Keywords are then entered in the text editor, and resulting delays are displayed for the macro symbol as in the HDL embodiments. This embodiment therefore provides a different method for initializing the delay estimation procedures.

In one embodiment, the names of the terminal nets of the critical paths are visually identified with the delays to which they correspond, for example by highlighting the names of the terminal nets of each path (wherever they appear in the HDL description) and the associated delay in the same color. Keyword color highlighting is provided in the GNU Emacs editor, and therefore is well-known in the software art. In another embodiment, in an analogy with temperature, black text indicates a slow net on the critical path, blue a net that is a bit faster, bright blue faster still, and white (on a darker background) a very fast net. The highlighted net names can be limited by the user to a range of nets. For example, the highlighting can be applied only to nets within 2 nanoseconds of the critical path delay, or within 10%, and so forth.

In one embodiment, all text inserted into the HDL description is logged (e.g., a copy is stored in a log file) so that the added information can be easily removed or edited in the HDL description. For example, all timing information can be removed from the HDL file in response to a single user command. For another example, existing timing information for the entire HDL file can be automatically updated, if desired, when the target process is changed.

The above text describes the timing annotation method of the invention in the context of FPGAs. However, the invention can also be applied to other fields of the electronic design art, such as the design of custom ICs, PLDs, or ASICs using standard cell libraries.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. A method for annotating timing information into an HDL description, the method comprising the steps of:

a) receiving a command to instantiate a library macro, the instantiation comprising a keyword;

b) calling a timing annotation procedure in response to the keyword;

c) retrieving the macro timing information from a speeds file comprising delay information for the macro, the macro timing information comprising delays for the same path through the macro under different operating conditions; and d) adding the timing information to the HDL description.

2. The method of claim 1, wherein the speeds file comprising delay information for the macro is a macro speeds file.

3. The method of claim 1, wherein the speeds file comprising delay information for the macro further comprises device delay data.

4. The method of claim 1, wherein in step d) when the timing information is added to the HDL description the names of the terminal nets of the critical paths are visually identified with the timing information to which they correspond.

5. The method of claim 4, wherein in step d) the names of the terminal nets of the critical path and the associated timing information are highlighted in the same color.

6. The method of claim 1, wherein the timing annotation procedure invokes synthesis of the library macro.

7. The method of claim 6, wherein the timing annotation procedure further places and routes the macro.

8. The method of claim 1, further comprising the step of:

e) adding the timing information to a log file.

9. The method of claim 1, wherein the macro timing information comprises minimum and typical delays.

10. A method for reporting macro timing information to a user editing an HDL description, the method comprising the steps of:

a) receiving a command to instantiate a library macro, the instantiation comprising a keyword;

b) calling a timing annotation procedure in response to the keyword;

c) retrieving the macro timing information from a speeds file comprising delay information for the macro, the macro timing information comprising delays for the same path through the macro under different operating conditions; and d) displaying the timing information to the user.

11. The method of claim 10, wherein the timing annotation procedure invokes synthesis of the library macro.

12. The method of claim 11, wherein the timing annotation procedure further places and routes the macro.

13. The method of claim 10, wherein the macro timing information comprises minimum and typical delays.

14. A method for annotating timing information into an HDL description, the method comprising the steps of:

a) receiving a command to instantiate a library macro, the instantiation comprising a keyword;

b) calling a timing annotation procedure in response to the keyword;

c) retrieving the macro timing information from a speeds file comprising delay information for the macro, the macro timing information comprising delays for the macro implemented in different FPGAs; and d) adding the timing information to the HDL description.

15. The method of claim 14, wherein the different FPGAs comprise FPGAs with different speed grades.

16. A method for reporting macro timing information to a user editing an HDL description, the method comprising the steps of:

a) receiving a command to instantiate a library macro, the instantiation comprising a keyword;

b) calling a timing annotation procedure in response to the keyword;

c) retrieving the macro timing information from a speeds file comprising delay information for the macro, the macro timing information comprising delays for the macro implemented in different FPGAS; and d) displaying the timing information to the user.

17. The method of claim 16, wherein the different FPGAs comprise FPGAs with different speed grades.

18. A method for reporting macro delays while entering an HDL description, the method comprising the steps of:

a) specifying a delay period such that any paths having a delay within the delay period of a critical path are reported, the critical path being the slowest path through the macro;

b) receiving a command to instantiate a library macro, the instantiation comprising a keyword;

c) calling a timing annotation procedure in response to the keyword;

d) determining a critical path delay through the macro;

e) reporting the critical path delay;

f) determining one or more additional macro delays; and g) reporting the additional delays.

19. A method for reporting macro delays while entering an HDL description, the method comprising the steps of:

a) specifying a percentage such that any paths having a delay within the specified percentage of a critical path are reported, the critical path being the slowest path through the macro:

b) receiving a command to instantiate a library macro, the instantiation comprising a keyword;

c) calling a timing annotation procedure in response to the keyword;

d) determining a critical path delay through the macro;

e) reporting the critical path delay;

f) determining one or more additional macro delays; and g) reporting the additional delays.

* * * * *